United States Patent [19]
Lee

[11] Patent Number: 5,978,241
[45] Date of Patent: Nov. 2, 1999

[54] WIDE-LINEAR RANGE TUNABLE TRANSCONDUCTOR USING MOS

[75] Inventor: Jiunn-Yih Lee, Chilung, Taiwan

[73] Assignee: Industrial Technology Research Institute, Hsinchu Hsien, Taiwan

[21] Appl. No.: 09/238,915

[22] Filed: Jan. 28, 1999

[51] Int. Cl.$^6$ .............................. H02M 7/00; G05F 3/20
[52] U.S. Cl. ............................. 363/73; 323/316; 327/103
[58] Field of Search ............................... 363/73; 323/312, 323/314, 315, 316, 317; 330/257, 260, 288; 327/103, 535, 538

[56] References Cited

U.S. PATENT DOCUMENTS

| | | | |
|---|---|---|---|
| 4,675,594 | 6/1987 | Reinke | 363/73 |
| 5,061,907 | 10/1991 | Rasmussen | 331/57 |
| 5,559,470 | 9/1996 | Laber et al. | 330/252 |
| 5,578,965 | 11/1996 | Kimura | 330/254 |
| 5,661,432 | 8/1997 | Chang et al. | 327/103 |
| 5,825,167 | 10/1998 | Ryat | 363/73 |

*Primary Examiner*—Matthew Nguyen
*Attorney, Agent, or Firm*—McDermott, Will & Emery

[57] ABSTRACT

Apparatus for converting input voltage to output current is disclosed herein. The apparatus mentioned above includes an input stage and a tuning stage. The input stage is used to generate a gate voltage corresponding to the input voltage, which is electrically coupled to the power source and ground. The input stage includes buffering means, a transistor, a resistor, and a first current repeating means. The first current repeating means generates the operational current responding to the current repeating transistor, and the input voltage is electrically coupled to the resistor by two input terminals of the buffering means. The gate of the transistor is connected to the output terminal of the buffering means, and the drain of the transistor is connected to the resistor and one of the two input terminals of the buffering means. The first current repeating means is used to repeat the operational current, and the local feed back is performed by connection between the buffering means, the transistor, and the resistor. The tuning stage is used to adjust the transconductance of the transconductor. The tuning stage generates the output current responding to the first control voltage, the second control voltage, and the gate voltage at the output terminal of the buffering means. The tuning stage includes a pair of transistors and the second current repeating means. The second current repeating means repeat the operational current, and the output current pass through the output terminal of the pair of transistors.

12 Claims, 4 Drawing Sheets

WIDE-LINEAR RANGE TUNABLE TRANSCONDUCTOR USING MOS

BACKGROUND OF THE INVENTION

1. Field of the Invention

This invention relates to a voltage-to-current converter that is also named as transconductor with wide linear range, especially relates to a low-voltage source, tunable transconductor with wide linear range transfer curve.

2. Description of the Prior Art

One basic converter named as voltage-to-current converter is designed according to an ideal voltage-control-current-source that has an output current $I_O$ and an input voltage $V_I$. The ratio $I_O/V_I$ denoted as $G_m$ (transconductance) which has nothing to do with the load resistor and the source resistor in the equivalent circuit of the ideal voltage-control-current-source. The voltage-to-current converter is an amplifier, which can produce an output current proportional to the input voltage. The ratio $I_O/V_I$ mentioned above is equal to the transconductance ($G_m$) of the amplifier.

A transconductor is a type of voltage-to-current converter, which has the gain $G_m$ depending on the bias current and the size of the transistor. As shown in FIG. 1, the aspect ratios of the transistors $Q_1$, $Q_2$, $Q_3$, and $Q_4$ are $10\mu/2\mu$, $10\mu/2\mu$, $10\mu/5\mu$, and $10\mu/5\mu$ respectively, wherein the unit is micrometer ($10^{-6}$ meter;$\mu$m). The input stage is composed of transistor $Q_1$ and $Q_2$, and the load stage is not shown in FIG. 1. The output current $I_O$ of the transconductor is equal to the subtraction ($I_p-I_n$), and is also equal to $G_m \times (V_{ip}-V_{in})$. The voltage $V_{ip}$ denotes the voltage at the gate ip$_3$ of the transistor $Q_3$, and the voltage $V_{in}$ denotes the voltage at the gate in$_4$ of the transistor $Q_4$. The transconductance $G_m$ depends on the current $I_{bias}$ and the size (aspect ratio) of every transistor. The current $I_{bias}$ is the current used to bias the differential pair. The gain of the transconductor mentioned above is the transconductance $G_m$.

As well known in the prior art, the transfer curve ($I_p$ versus $V_{ip}$ or $I_n$ versus $V_{in}$) has a linear region that the current is linearly proportional to the voltage. The slope of linear region is the transconductance (gain) of the transconductor, and the transconductance of the amplifier can be controlled by adjusting the input voltage of the differential pair. The gain (transconductance) of the transconductor mentioned above operates ether in a linear region or in a nonlinear region depending on the variation of the bias current (or input voltage) of the differential pair. The transconductor can be used only when the differential pair is operating in the linear region of the transfer curve. It is preferred that the transconductor has a wider linear region of the transfer curve.

The circuit diagrams of various types of the traditional transconductor are shown in FIG. 2A–FIG. 2B. The circuit diagram of the first type of the degeneration transconductor is shown in FIG. 2A, and the circuit diagram of the second type of the degeneration transconductor is shown in FIG. 2B. In FIG. 2A, a resistor R electrically couples the sources of the transistors $Q_5$ and $Q_6$. The resistor R mentioned above can increase the range of the linear region of the transfer curve of the transconductor. In other words, when the transconductor shown in FIG. 2A operates within an input voltage level larger than that of the transistor shown in FIG. 1, the gain of the transconductor shown in FIG. 2A can remain a fixed value. In addition, the aspect ratios of the transistors $Q_5$, $Q_6$, $Q_7$, $Q_8$ and $Q_9$ shown in FIG. 2A are $30\mu/2\mu$, $30\mu/2\mu$, $30\mu/2\mu$, $30\mu/2\mu$ and $30\mu/2\mu$ respectively.

The drains of the transistor $Q_5$ and $Q_6$ are electrically coupled to the load stage (not shown) of the amplifier. The circuit diagram of an alternative type of the transconductor shown in FIG. 2A is illustrated in FIG. 2B. The resistor R in FIG. 2A is replaced by a transistor $Q_{10}$ in FIG. 2B, and the transistor $Q_{10}$ is controlled by the voltage $V_{ctl}$ at the gate of the transistor $Q_{10}$. The transistor $Q_{10}$ in FIG. 2B acts as the resistor R in FIG. 2A, and is of the aspect ratio $2\mu/20\mu$. The value of the transconductance of the transconductor shown in FIG. 2B can be controlled by adjusting the voltage ($V_{tcl}$) at the gate of the transistor $Q_{10}$. So the transconductance of the transconductor in FIG. 2B can be changed, whereas the transconductance of the transconductor in FIG. 2A is fixed.

SUMMARY OF THE INVENTION

Because the transconductance of the transconductor in the prior art can be adjusted only in a narrow range, and the range of the linear region of the transfer curve of the traditional transconductor is small. The present invention provides a wide-linear range tunable transconductor. According to the present invention, apparatus for converting input voltage to output current is disclosed herein. Apparatus mentioned above acts as a voltage-to-current converter (transconductor) which has the gain "transconductance".

Apparatus mentioned above includes an input stage and a tuning stage. According to the preferred embodiment of the present invention, the input stage includes a pair of buffering means, a pair of transistors, a resistor, and a pair of first current repeating means. The pair of first current repeating means generates the operational current responding to a current on the current repeating transistor, and the input voltage is electrically coupled to the resistor by two input terminals of the pair of the buffering means. The gates of the pair of transistors are connected to the output terminal of the pair of buffering means, and the drains of the pair of transistors are connected to the resistor and one of the two input terminals of the pair of the buffering means. The first current repeating means is used to repeat the operational current according to the current passing through the current repeating transistor, and the local feed back is performed by connection between the pair of buffering means, the transistor, and the resistor.

The tuning stage is used to control transconductance of the transconductor. The tuning stage mentioned above generates the output currents responding to the first control voltage, the second control voltage, and the gate voltages at the output terminal of the pair of buffering means. The tuning stage includes a pair of differential-pair transistors and a pair of the second current repeating means. The pair of the second current repeating means repeats the operational current that is necessary for the operation of the differential-pair transistors. In addition, the output current passes through the output terminal of the pair of transistors.

BRIEF DESCRIPTION OF THE DRAWINGS

The above features of the present invention will be more clearly understood from consideration of the following descriptions in connection with accompanying drawings in which.

DESCRIPTION OF THE PREFERRED EMBODIMENT

Figure 1:
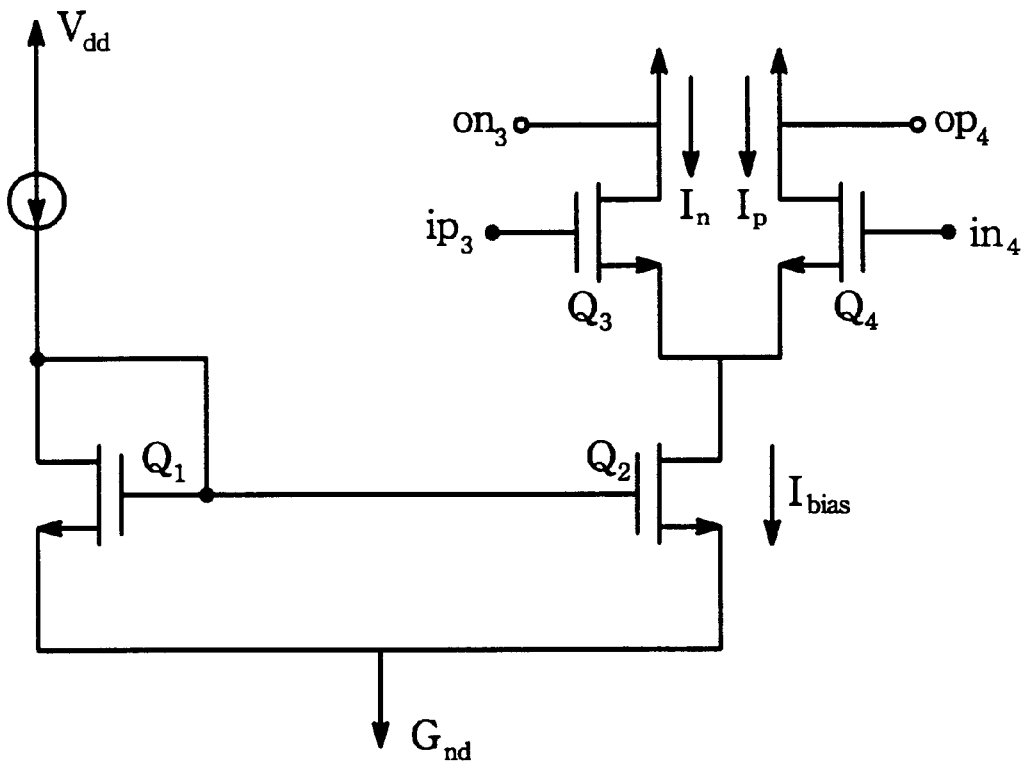
FIG. 1 is the circuit diagram of a traditional transconductor.
Figure 2A:
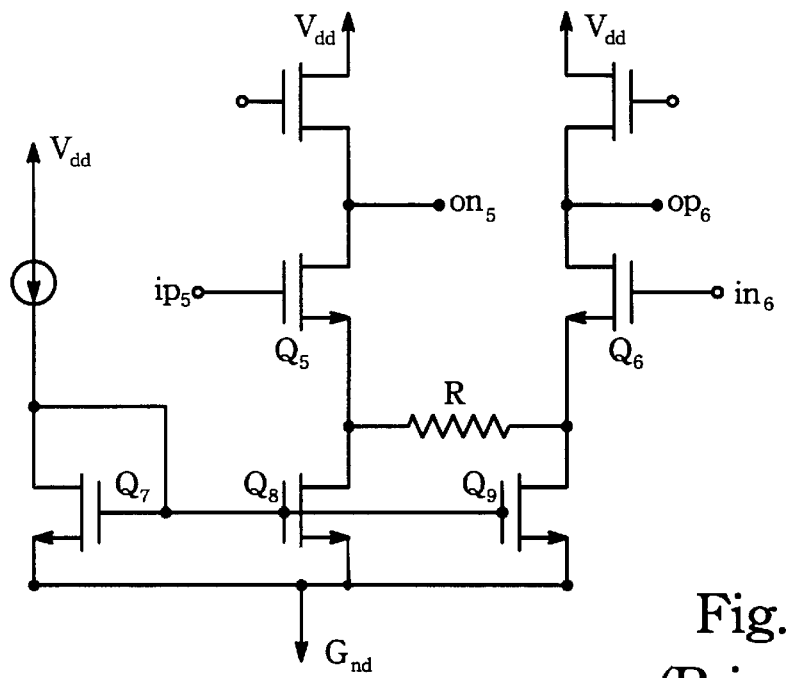
FIG. 2A is the circuit diagram of the first type of the degeneration transconductor using a resistor in the input stage of the transconductor.
Figure 2B:
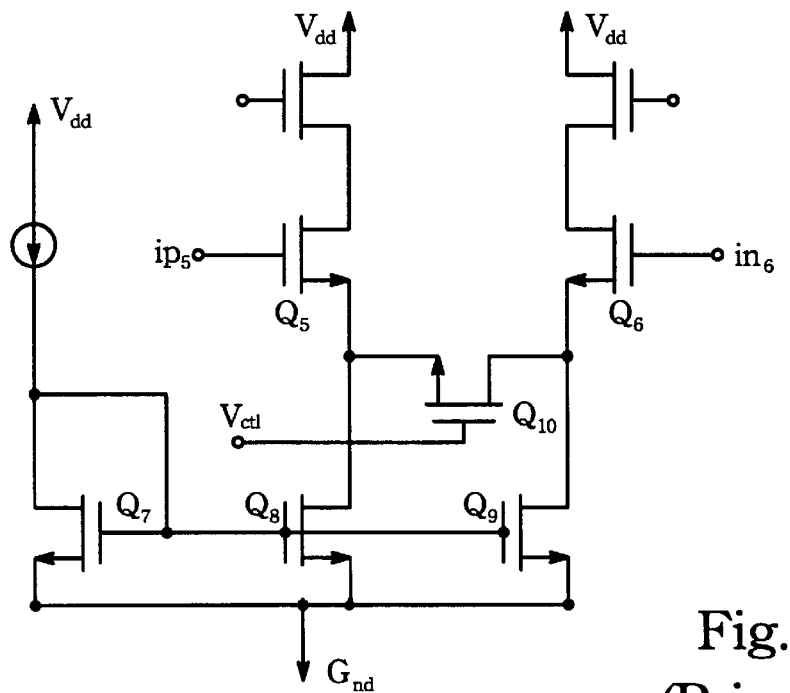
FIG. 2B is the circuit diagram of the second type of the degeneration transconductor using a transistor controlled by a voltage in the input stage of the transconductor.
Figure 3:
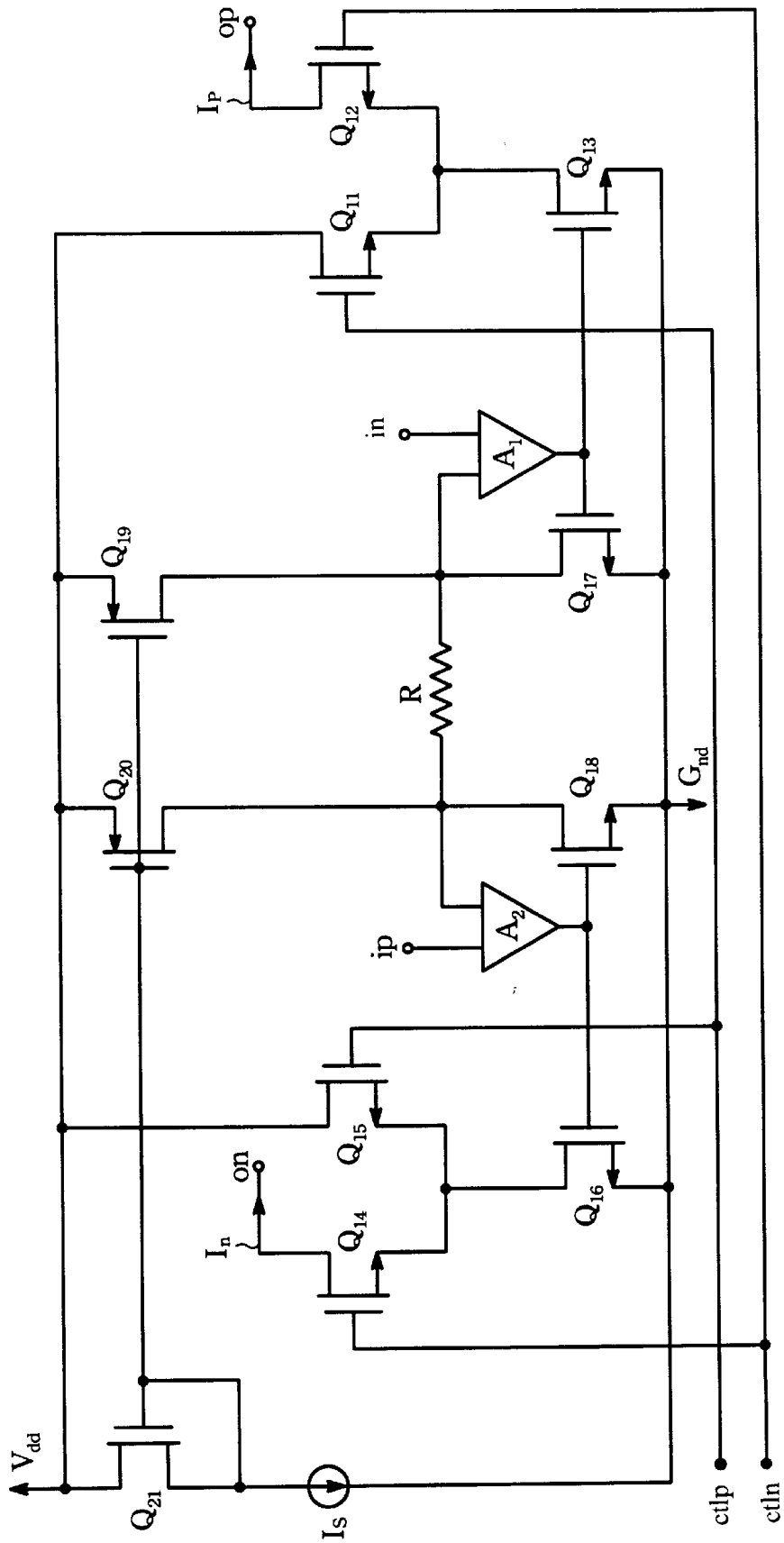
FIG. 3 is the circuit diagram of the transconductor according to one preferred embodiment of the present invention.

To improve the characteristic of the traditional transconductor, the present invention provides a circuit diagram shown in FIG. 3, which has a wider linear region in the transfer curve than that of the traditional transconductor. In addition, the present invention provides a transconductor that the transconductance of the transconductor can be adjusted. The gate voltages of the differential pair $Q_{11}$-$Q_{12}$ and $Q_{14}$-$Q_{15}$ are both controlled by the voltage applied at the terminals ctln and ctlp. As illustrated in FIG. 1, FIG. 2A and FIG. 2B, the traditional transconductor has 3 transistors cascode connected between the power source ($V_{dd}$) and the ground ($G_{nd}$). Whereas, the connection of the present invention uses local feedback, so there are only two transistors cascode connected between the power ($V_{dd}$) and the ground ($G_{nd}$). Thus the linear region of the transfer curve of the transconductor in the present invention is enlarged.

In addition, the differential pairs $Q_{11}$-$Q_{12}$ and $Q_{14}$-$Q_{15}$ make the transconductance of the transconductor according to the present invention adjustable. The differential pair $Q_{11}$-$Q_{12}$ together with the transistor $Q_{13}$, and the differential pair $Q_{14}$-$Q_{15}$ together with the transistor $Q_{16}$ make up the tuning stage of the transconductor shown in FIG. 3, and the tuning stage is controlled by the voltages at the terminals ctln and ctlp. Furthermore, the output terminals of the first operational amplifier $A_1$ and the second operational amplifier $A_2$ are electrically coupled to the gates of the transistor $Q_{17}$, $Q_{13}$, and $Q_{16}$, $Q_{18}$ respectively. The sources of the transistors $Q_{17}$, $Q_{13}$, and $Q_{16}$, $Q_{18}$ are coupled to the ground ($G_{nd}$). The gates of the transistors $Q_{17}$ and $Q_{18}$ are coupled to the positive input terminals of the first operational amplifier $A_1$ and the second operational amplifier $A_2$ respectively. The sources of the transistors $Q_{19}$ and $Q_{20}$ are electrically coupled to the power source ($V_{dd}$), in addition, the drains of the transistors $Q_{19}$ and $Q_{20}$ are electrically coupled to the positive input terminals of the first operational amplifier $A_1$ and the second operational amplifier $A_2$ respectively. In addition, as shown in FIG. 3, a resistor (R) electrically couples the positive input terminals of the first operational amplifier $A_1$ and the second operational amplifier $A_2$. The input voltage applied to the input stage of the apparatus according to the present invention is applied on the across the negative input terminals of the first operational amplifier $A_1$ and the second operational amplifier $A_2$ respectively. According to the preferred embodiment of the present invention, the input stage of the transconductor includes the resistor R, the operational amplifiers $A_1$, $A_2$, the transistors $Q_{17}$, $Q_{18}$, $Q_{19}$, and $Q_{20}$, which are connected according to local feed back mentioned above.

The sources of the transistors $Q_{11}$, $Q_{12}$ and $Q_{14}$, $Q_{15}$ are electrically coupled to the drains of the transistors $Q_{13}$ and $Q_{16}$ respectively, in addition, the drains of the transistors $Q_{11}$ and $Q_{15}$ are electrically coupled to the power source ($V_{dd}$). The current in the drain (op) of the transistor $Q_{12}$ is $I_p$, the current in the drain (on) of the transistor $Q_{14}$ is $I_n$. So the output current $I_O$ (not shown in FIG. 3) of the transconductor in the preferred embodiment of the present invention is equal to $I_p$-$I_n$.

The source of the transistor $Q_{21}$ is electrically coupled to the power source ($V_{dd}$), besides, the gate and the drain of the transistor $Q_{21}$ is electrically coupled to the gates of the transistors $Q_{19}$ and $Q_{20}$. The first terminal of the current source $I_s$ coupling to the drains of the transistor $Q_{21}$ is also coupled to the gate of the transistor $Q_{21}$. In addition, the second terminal of the current source $I_s$ is electrically coupled to the ground, so the current passing through the transistors $Q_{21}$ is repeated by the transistors $Q_{19}$, $Q_{20}$, $Q_{16}$, and $Q_{13}$. Through the generation of the repeated current in the transistors $Q_{19}$, $Q_{20}$, $Q_{16}$, and $Q_{13}$, the bias current that must be used to bias the transistors in the operation region is provided.

When input voltage $V_{ip}$ and voltage $V_{in}$ are applied at the negative input terminals of the second operational amplifier $A_2$ and the first operational amplifier $A_1$ respectively, the differential input voltage applied to the input stage of the transconductor shown in FIG. 3 is $V_{ip}$-$V_{in}$. According to the definition of the output current ($I_O$) of the transconductor, the output current ($I_O$) not only equals to the subtraction of current $I_p$ and $I_n$, but also equals to the product of the transconductance $G_m$ and the subtraction of voltage $V_{ip}$ and $V_{in}$. For the principle mentioned above, the output current of the transconductor shown in FIG. 3 denoted lo can be expressed as $I_n$-$I_p$ that is equal to $G_m$ multiplied by ($V_{ip}$-$V_{in}$).

Because the voltage at the gates of the differential pairs $Q_{11}$-$Q_{12}$ and $Q_{14}$-$Q_{15}$ of the tuning stage of the transconductor shown in FIG. 3 is controlled by the voltage at the terminal ctlp and terminal ctln. So the voltages at the terminal ctlp and terminal ctln control the transconductance $G_m$ of the transconductor shown in FIG. 3. Besides, due to the characteristic of the operational amplifier, the positive input terminal and the negative input terminal of an operational amplifier can be considered as virtual short. The first operational amplifier $A_1$ and the second operational amplifier $A_2$ in the input stage of the transconductor shown in FIG. 3 act as buffers. So the connection of the first operational amplifier $A_1$ and the second operational amplifier $A_2$ in the input stage of the transconductor shown in FIG. 3 makes the local feedback. In addition, the two cascode transistors between the power source ($V_{dd}$) and the ground ($G_{nd}$) enlarge the range of the linear region of the transfer curve (not shown) that is plotted according to $I_O$ versus ($V_{ip}$-$V_{in}$) of the transconductor shown in FIG. 3.

According to the preferred embodiment of the present invention shown in FIG. 3, some modifications can be made without departing the scope of the present invention. For example, the resistor R shown in FIG. 3 can be replaced with a transistor. In addition, although the transistor used in the preferred embodiment of the present invention is field effect transistor (FET), all the transistors used in the preferred embodiment of the present invention can be replaced with other types of transistor. In one preferred embodiment of the present invention, the aspect ratio of the transistors $Q_{17}$, $Q_{18}$, $Q_{19}$, and $Q_{20}$ are all 30 $\mu$m/2 $\mu$m. In addition, the resistance of the resistor R shown in FIG. 3 is 50 K ohms. The transistors $Q_{19}$, $Q_{20}$, and $Q_{21}$ can be made up of P-type metal oxide semiconductor transistor (PMOS). In addition, the other transistors shown in FIG. 3 are of N-type metal oxide semiconductor transistor (NMOS). In the contrary, when the transistors $Q_{19}$, $Q_{20}$, and $Q_{21}$ can be made up of N-type metal oxide semiconductor field effect transistor (NMOS). Similarly, the other transistors shown in FIG. 3 are of P-type metal oxide semiconductor field effect transistor (PMOS). To compare the resulted transconductance according to traditional transconductors shown in FIG. 1, FIG. 2A, FIG.

2B, and the transconductor in the present invention shown in FIG. 3, the resulted transconductance curve according to the transconductors mentioned above are shown in FIG. 4.

Figure 4:
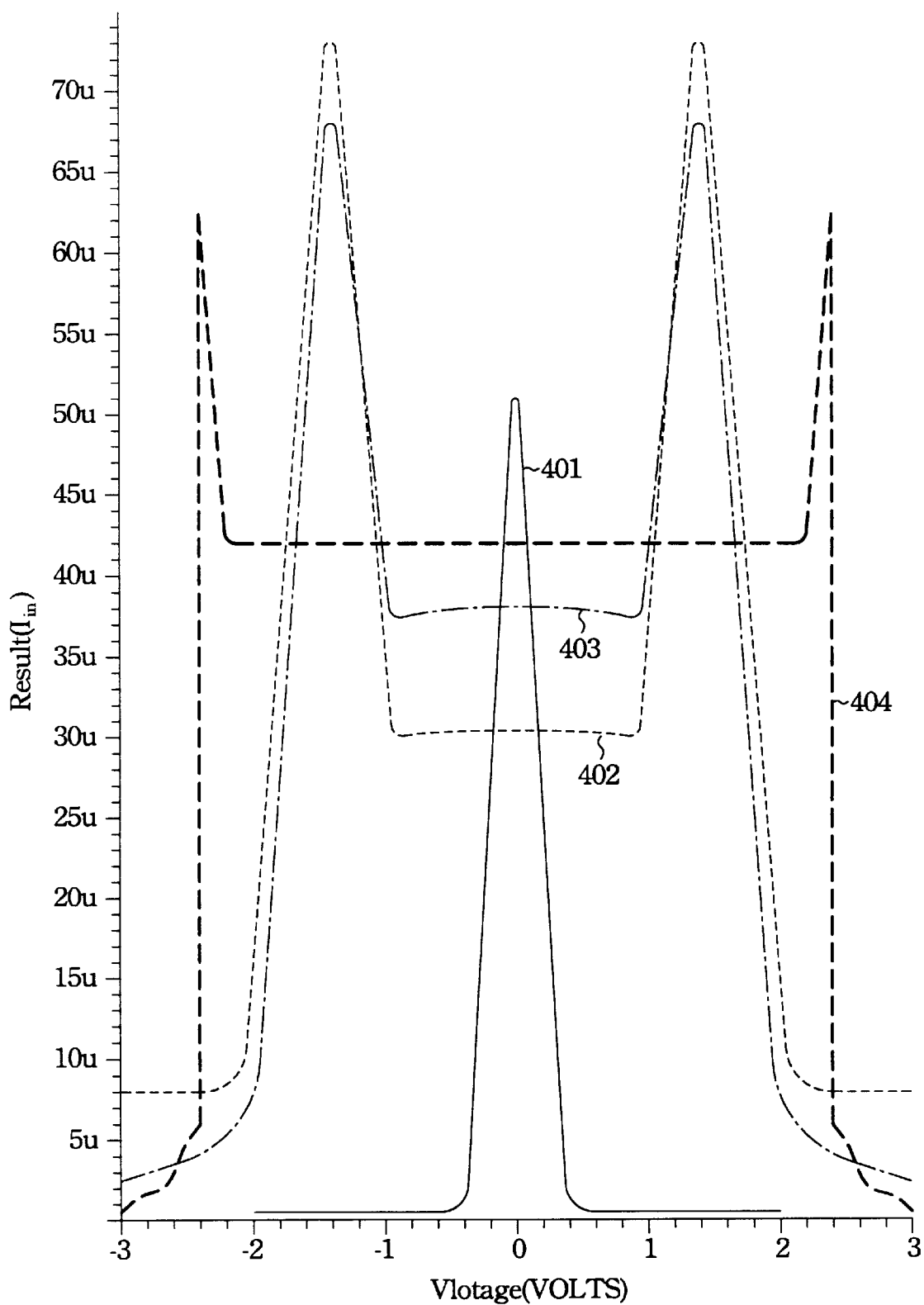
FIG. 4 illustrates the simulated transconductance curves according to the traditional transconductor, the first type of the degeneration transconductor, the second type of the degeneration transconductor, and the transconductor in the preferred embodiment of the present invention.

Take the parameter relating to the transconductor described in the prior art of the specification shown in FIG. 1, FIG. 2A, and FIG. 2B as an example, the simulated transconductance curve of every type of the transconductor is shown as curve 401, 402, and 403 respectively. Besides, the simulated transconductance curve of the transconductor according to the preferred embodiment of the present invention is shown as curve 404. It is obvious that the curve 404 has a flat shape that is much wider than that of the other curve 401, 402, and 403. As illustrated in FIG. 4, it is obvious that the transconductor according to the preferred embodiment of the present invention has wider linear region than that of the transconductor according to the prior art. In addition, even though the voltage applied at the input terminal of the transconductor in the present invention is a low voltage (such as 3 volts). The transfer curve according to the transconductor in the present invention can remain in the linear region within a scope (such as 4.6 volts).

As will be understood by persons skilled in the art, the foregoing preferred embodiment of the present invention is illustrative of the present invention rather than limiting the present invention. Having described the invention in connection with a preferred embodiment. For example, if various type of transistor is used in the preferred embodiment, as long as the local feedback connection of the buffer, and tuning stage controlled by differential input voltage are utilized, the modification will now suggest itself to those skilled in the art. The buffering means in the preferred embodiment of the present invention can be a buffer, in addition, the current repeating means can be a current mirror. While the preferred embodiment of the invention has been illustrated and described, it will be appreciated that various changes can be made therein without departing from the spirit and scope of the invention.

What is claimed is:

1. Apparatus for converting an input voltage to an output current, a current source being used to generating an operational current provided for operation of said apparatus, said operational current passing through a current repeating transistor, said apparatus comprising:

an input stage for generating a gate voltage responding to said input voltage, said input stage being electrically coupled to a power source and ground, said input stage comprising buffering means, a transistor, a resistor, and first current repeating means, said first current repeating means generating said operational current according to said current repeating transistor, said input voltage being electrically coupled to said resistor by two input terminals of said buffering means, gates of said transistor being electrically coupled to output terminals of said buffering means, drain of said transistor being electrically coupled to said resistor and one of said two input terminals of said buffering means, in addition, source of said transistor being electrically coupled to ground, a gate of said first current repeating means being electrically coupled to said current repeating transistor, a source of said first current repeating means being electrically coupled to said power source, a drain of said first current repeating means being coupled to said resistor, a local feed back being performed by connection of said buffering means, said transistor, and said resistor; and a tuning stage for generating said output current responding to a first control voltage, a second control voltage, and said gate voltage at said output terminal of said buffering means, said tuning stage comprising a pair of transistors and second current repeating means, said second current repeating means repeating said operational current that being provided for operation of said pair of transistors, a gate of said second current repeating means being electrically coupled to said output terminal of said buffering means, a source of said second current repeating means being electrically coupled to ground, a drain of said second current repeating means being electrically coupled to both sources of said pair of transistors, said first control voltage and said second control voltage being applied to said gates of said pair of transistor respectively, a drain of one of said pair of transistors being electrically coupled to said power source, said output current passing through a drain of the other one of said pair of transistors.

2. Apparatus as claim 1, wherein said first current repeating means is made up of metal oxide semiconductor field effect transistor (MOSFET).

3. Apparatus as claim 1, wherein said buffering means is an operational amplifier.

4. Apparatus as claim 1, wherein said transistor is made up of metal oxide semiconductor transistor.

5. Apparatus as claim 1, wherein said second current repeating means is made up of metal oxide semiconductor field effective transistor.

6. Apparatus as claim 1, wherein said pair of transistors are made up of metal oxide semiconductor transistor.

7. Apparatus for converting an input voltage to an output current, a current source being used to generating an operational current provided for operation of said apparatus, said operational current passing through a current repeating transistor, said apparatus comprising:

an input stage for generating a pair of gate voltages responding to said input voltage, said input stage being electrically coupled to a power source and ground, said input stage comprising a pair of buffering means, a pair of transistors, a resistor, and a pair of first current repeating means, said pair of first current repeating means generating said operational current according to said current repeating transistor, said input voltage being electrically coupled to said resistor by a first input terminal and a second input terminal of said pair of buffering means, gates of said pair of transistors being electrically coupled to output terminals of said pair of buffering means respectively, drain of one of said pair of transistors being electrically coupled to first terminal of said resistor and positive input terminal of one of said buffering means, a drain of the other one of said pair of transistors being electrically coupled to second terminal of said resistor and positive input terminal of the other one of said buffering means, sources of said pair of transistors being electrically coupled to ground, gates of said pair of first current repeating means being electrically coupled to said current repeating transistor, sources of said pair of first current repeating means being electrically coupled to said power source, drain of one of said pair of first current repeating means being coupled to said first terminal of said resistor, drain of the other one of said pair of first current repeating means being connected to said second terminal of said resistor, a local feed back being performed by connection of said pair of buffering means, said pair of transistors, and said resistor; and a tuning stage for generating said output current responding to a first control voltage, a second control voltage, and said pair of gate voltages at said output terminals of said pair of buffering means, said tuning stage comprising a pair of differential-pair transistors and a pair of second current repeating means, said pair of second current repeating means repeating said operational current that being provided for operation of said pair of differential-pair transistors, gate of one of said pair of second current repeating means being electrically coupled to one of said output terminals of one of said pair of buffering means, gate of the other one of said pair of second current repeating means being electrically coupled to one of said output terminals of the other one of said pair of buffering means, source of each of said pair of second current repeating means being electrically coupled to ground, drain of each of said pair of second current repeating means being electrically coupled to said source of each of said pair of differential-pair transistors, said first control voltage and said second control voltage being applied to gate of each of said pair of differential-pair transistors respectively, drain of one of said pair of differential-pair transistors being electrically coupled to said power source, said output current passing through drain of the other one of said pair of differential-pair transistors.

8. Apparatus as claim 7, wherein said pair of first current repeating means comprises two metal oxide semiconductor field effect transistors (MOSFET).

9. Apparatus as claim 7, wherein said pair of buffering means comprises two operational amplifiers.

10. Apparatus as claim 7, wherein said pair of transistors comprises metal oxide semiconductor field effect transistors.

11. Apparatus as claim 7, wherein said pair of second current repeating means comprises two metal oxide semiconductor transistors.

12. Apparatus as claim 10, wherein said pair of differential-pair transistors comprises metal oxide semiconductor transistors.

* * * * *